(12) United States Patent
Wojtczak et al.

(10) Patent No.: US 7,534,752 B2
(45) Date of Patent: May 19, 2009

(54) POST PLASMA ASHING WAFER CLEANING FORMULATION

(75) Inventors: William A. Wojtczak, Austin, TX (US); Ma. Fatima Seijo, Hayward, CA (US); Thomas J. Kloffenstein, Morgan Hill, CA (US); Daniel N. Fine, Peabody, MA (US); Stephen A. Fine, legal representative, Peabody, MA (US)

(73) Assignee: Advanced Technology Materials, Inc., Danbury, CT (US)

( * ) Notice: Subject to any disclaimer, the term of this patent is extended or adjusted under 35 U.S.C. 154(b) by 215 days.

(21) Appl. No.: 09/954,284

(22) Filed: Sep. 17, 2001

(65) Prior Publication Data

US 2002/0068685 A1   Jun. 6, 2002

(51) Int. Cl.
   *C11D 7/32* (2006.01)
(52) U.S. Cl. ............................ 510/175; 510/176
(58) Field of Classification Search ................ 510/175, 510/176, 499, 255, 505, 402; 134/2, 1, 3, 134/38, 40, 42
   See application file for complete search history.

(56) References Cited

U.S. PATENT DOCUMENTS

| | | | | |
|---|---|---|---|---|
| 4,165,295 A * | 8/1979 | Vander Mey | ................ | 510/176 |
| 4,221,674 A | 9/1980 | Vander Mey | | |
| 4,395,348 A * | 7/1983 | Lee | .............. | 510/176 |
| 4,744,834 A | 5/1988 | Haq | | |
| 5,183,552 A | 2/1993 | Bressel et al. | | |
| 5,236,552 A * | 8/1993 | Fang | ............. | 216/48 |
| 5,334,332 A | 8/1994 | Lee | | |
| 5,466,389 A | 11/1995 | Ilardi et al. | | |
| 5,496,590 A * | 3/1996 | Maki et al. | ................. | 427/96.2 |
| 5,498,293 A | 3/1996 | Ilardi et al. | ................. | 134/3 |
| 5,518,579 A * | 5/1996 | Katsuyama et al. | .......... | 438/782 |
| 5,571,447 A * | 11/1996 | Ward et al. | .................. | 510/206 |
| 5,612,304 A * | 3/1997 | Honda et al. | ................ | 510/176 |
| 5,665,688 A | 9/1997 | Honda et al. | ................ | 510/178 |
| 5,795,702 A * | 8/1998 | Tanabe et al. | ............... | 430/331 |
| 5,891,454 A | 4/1999 | Wu | | |
| 5,977,041 A | 11/1999 | Honda et al. | | |
| 6,033,993 A | 3/2000 | Love et al. | | |
| 6,103,680 A * | 8/2000 | Honda et al. | | |
| 6,143,707 A | 11/2000 | Trinh et al. | | |
| 6,211,126 B1 | 4/2001 | Wojtczak et al. | | |
| 6,323,168 B1 * | 11/2001 | Kloffenstein et al. | ....... | 510/175 |
| 6,730,644 B1 | 5/2004 | Ishikawa et al. | | |
| 2002/0068684 A1 * | 6/2002 | Peters et al. | ................. | 510/175 |
| 2002/0068685 A1 * | 6/2002 | Wojtczak et al. | ............ | 510/175 |
| 2002/0130298 A1 * | 9/2002 | Ichiki | ......................... | 252/79.1 |
| 2003/0148910 A1 * | 8/2003 | Peters et al. | ................. | 510/405 |
| 2005/0119143 A1 * | 6/2005 | Egbe et al. | .................. | 510/175 |

FOREIGN PATENT DOCUMENTS

| | | | |
|---|---|---|---|
| EP | 0702399 | | 3/1966 |
| JP | 49002739 A | * | 1/1974 |
| JP | 356012740 A | * | 2/1981 |
| JP | 1-122600 | | 5/1989 |
| JP | 04300081 A | * | 10/1992 |
| JP | 7-37846 | | 2/1995 |
| WO | 9800244 A1 | | 1/1998 |
| WO | WO 9800244 A1 | * | 1/1998 |
| WO | WO98/28395 | * | 7/1998 |

OTHER PUBLICATIONS

Sigma Chemical Corporation, Product Catalog 1991, p. 593.*
Gunter Petzow (Metallographic Etching, American Society of Metals, copyright 1978).*
Kern, "Overview and evolution of semiconductor wafer contamination and cleaning technology", pp. 3-67 in Kern, ed., Handbook of Semiconductor Wafer Cleaning Technology, Noyes Publications, Westwood, New Jersey, 1993.

* cited by examiner

*Primary Examiner*—Gregory E Webb
(74) *Attorney, Agent, or Firm*—Chih-Sheng (Jason) Lin; Tristan A. Fuierer; Moore & Van Allen, PLLC

(57) ABSTRACT

A semiconductor wafer cleaning formulation for use in post plasma ashing semiconductor fabrication comprising at least one organic chelating agent and at least one polar solvent, wherein the chelating agent and polar solvent are in sufficient amounts to effectively remove inorganic compound residue from a semiconductor wafer. Preferably, the chelating agent is selected from the group consisting of 2,4-Pentanedione, Malonic acid, Oxalic acid, p-Toluenesulfonic acid, and Trifluoroacetic acid; and the polar solvent is selected from the group consisting of Water, Ethylene glycol, N-Methylpyrrolidone (NMP), Gamma butyrolactone (BLO), Cyclohexylpyrrolidone (CHP), Sulfolane, 1,4-Butanediol, and Butyl carbitol.

34 Claims, No Drawings

POST PLASMA ASHING WAFER CLEANING FORMULATION

BACKGROUND OF THE INVENTION

1. Field of the Invention

The present invention relates generally to chemical formulations used in semiconductor wafer fabrication and particularly to chemical formulations and methods to remove photoresist residues from semiconductor substrates following a resist plasma ashing step.

2. Description of the Prior Art

Semiconductor integrated circuits are produced by a process in which a photoresist is applied onto an inorganic substrate. Typically the fabrication of a photoresist involves the creation of a metalized layer having a patterned resist layer formed thereon. Initially, the pattern is formed on the photoresist by exposure to light and subsequent development and the formed pattern is then used as a mask. The portions of the inorganic substrate not masked by the pattern of the photoresist are etched by exposure to a metal etching plasma (such as a halogen based plasma) to remove exposed metal to form fine circuits. Then the photoresist is removed from the inorganic substrate by an etching step as described above. Next, a plasma ashing step is conducted (typically using an oxygen based plasma) in which the remaining resist is removed from the wafer. Finally, the remaining residue that is predominantly composed of inorganic compounds such as metal halides and metal oxides is removed from the inorganic substrate. The result is a patterned metalized layer.

Various chemical formulations are currently used to remove the inorganic compound residue. These formulations are generally holdovers from older semiconductor fabrication wet chemical resist removal processes that were used prior to the introduction of the resist plasma ashing technology. Typically, these prior art chemical formulations include strong reagents such as strong inorganic acids, strong bases and/or reactive amine containing compounds. However, such strong reagents can cause unwanted further removal of metal or insulator layers remaining on the wafer and are therefore undesirable in many instances. Additionally, strippers containing both amine component(s) and water may corrode metal, particularly copper, aluminum and aluminum-copper alloys.

Accordingly, it would be advantageous to provide improved chemical formulations to effectively remove residue following a resist ashing step that does not corrode and/or potentially degrade delicate structures which are meant to remain on a semiconductor wafer. Non-oxidizing acidic solvent solutions offer efficient residue removal and good compatibility with sensitive metals and dielectrics materials.

SUMMARY OF THE INVENTION

The present invention relates to chemical formulations for removing residue from semiconductor wafers following a resist plasma ashing step that provides substantially complete removal of residue without any significant attack taking place on the semiconductor substrate thereby increasing the yield of acceptable products.

In one aspect, the invention relates to a chemical formulation which is highly effective in removing inorganic residue, such as metal halide and metal oxide residue from semiconductor substrates while at the same time being "non-reactive" to the substrate and any metalization or dielectric features.

Another aspect relates to improved chemical formulations that do not expose personnel handling such formulations to any significant toxicity hazards and that cause minimal ecological impact due to the nature of the compositions.

Yet another aspect relates to chemical formulations that provide semiconductor surfaces having enhanced adhesion and surface uniformity.

A further aspect relates to chemical formulations that contain essentially no highly reactive agents, such as strong inorganic acids, strong bases, amine containing compounds and/or catalysts.

Thus, in accordance with one aspect of the present invention, there is provided a semiconductor wafer cleaning formulation for use in post plasma ashing semiconductor fabrication comprising at least one organic chelating agent and at least one polar solvent, wherein the chelating agent and polar solvent are in sufficient amounts to effectively remove residues from a semiconductor wafer.

Another embodiment of the present invention provides for a semiconductor wafer cleaning formulation for use in post plasma ashing semiconductor fabrication comprising:

at least one organic chelating agent; and at least one polar solvent, wherein the organic chelating agent and polar solvent components are present in an amount ranging from about 2% to about 98% by weight.

Examples of the chelating agent may include, but are not limited to, dicarboxylic acids, and substituted dicarboxylic acids, such as Glutaric acid, Succinic acid, Malonic acid, Oxalic acid; polyhydric phenols, such as Catechol; diketones, such as 2,4-Pentanedione. Preferably, the chelating agent includes 2,4-Pentanedione, Catechol, Malonic acid, Oxalic acid, p-Toluenesulfonic acid, and Trifluoroacetic acid. Examples of preferred solvents include water, Ethylene glycol, N-Methylpyrrolidone (NMP), gamma Butyrolactone (BLO), Cyclohexylpyrrolidone (CHP), Sulfolane, 1,4-Butanediol, and Butyl carbitol.

In accordance with another embodiment of the present invention, a semiconductor substrate having a surface area covered with a residue from an ashing process is immersed in a chemical formulation as described above under conditions sufficient to effectively remove substantially all remaining residue.

The formulations of this invention are advantageous for removal of ashing residue because they contain less toxic and hazardous reagents than other compositions used heretofore.

These and other advantages of the present invention will become apparent to those of ordinary skill in the art upon review of the following detailed description of the preferred embodiments.

DETAILED DESCRIPTION OF THE PREFERRED EMBODIMENTS

In accordance with the present invention chemical formulations are set forth for removal of inorganic compound residues from substrates, generally from a semiconductor substrate. The chemical formulations of the present invention have the advantage of containing essentially no strong inorganic acids, strong bases and/or amine compounds usually present in the formulations of the prior art.

A general formulation of the present invention comprises at least one organic chelating agent and one polar solvent present in the following ranges (where the percent (%) given is percent by weight):

Organic Chelating Agent from about 1% to about 15%;

Water from about 15% to about 98; and

Polar Organic Solvent from about 0% to about 75%.

As is seen from the above formulation ranges, a first series of formulations exists where there is zero amount of a polar organic solvent.

A preferred general formulation is created wherein the organic chelating agent is Catechol (1,2-dihydroxybenzene) and the polar organic solvent is gamma butyrolactone (BLO). Thus, a preferred general formulation comprises:

Catechol—from about 1% to about 15%;
Water—from about 25% to about 98%; and
BLO—from about 10% to about 60%.

Regarding the three component formulations described above, a preferred three component formulation within the range of parameters consists essentially of:

Catechol—from about 7% to about 12%;
Water—from about 48% to about 83%; and
BLO—from about 10% to about 40%.

The preparation of the wafer cleaning solution according to the present invention is carried out in a simple manner by dissolution or mixing of the components, optionally with slight heating. After fine filtration, which may be necessary to guarantee a solution free from particles which is basic in semiconductor electronics, the wafer cleaning solution is ready for use.

The present invention also provides a method of removing remaining residue from a surface after an ashing process. In accordance with the methods of the present invention, the substrate is immersed in a formulation of the present invention as described hereinabove under conditions sufficient to remove residue from the substrate. Such removal conditions are not critical and will generally comprise a temperature ranging from about 20° C. to about 130° C., and preferably from about 40° C. to about 80° C., with an immersion time ranging from about 5 minutes to 60 minutes and preferably about 30 minutes.

To someone of ordinary skill in the art it would be expected that chelating agents related to catechol and other organic chelating agents may also be utilized with comparable results. Catechol-related chelating agents would include derivatives of benzene, naphthalene, and aromatic heterocyclic compounds having at least two hydroxyl (OH) groups on adjacent carbon atoms.

Other polar organic solvents that may be utilized include N-Methylpyrrolidone (NMP); Propylene glycol monomethylether acetate (PMA); Ethylene glycol; propylene glycol; and Dimethylsulfoxide.

Additional formulations have been developed for stripping wafer residue that originates from plasma metal etching followed by ashing. The additional formulations comprise the following components (percentage by weight):

at least one organic chelating agent compound from about 2% to about 98%; and
at least one polar solvent from about 2% to about 98%
wherein the preferred organic chelating agent compounds are:
   2,4-Pentanedione—from about 0.01% to about 98%
   Malonic acid—from about 0.01% to about 10%
   Oxalic acid—from about 0.01% to about 10%
   p-Toluenesulfonic acid—from about 0.01% to about 10%
   Trifluoroacetic acid—from about 0.01% to about 12%
and the preferred polar solvents are:
   Water—from about 0.01% to about 98%
   Ethylene glycol—from about 0.01 to about 98%
   N-Methypyrrolidone (NMP)—from about 0.01% to about 98%
   Gamma butyrolactone (BLO)—from about 0.01% to about 40%
   Cyclohexylpyrrolidone—from about 0.01% to about 75%
   Sulfolane—from about 0.01% to about 70%
   1,4-Butanediol,—from about 0.01% to about 75%
   Butyl carbitol—from about 0.01% to about 70%

Preferred solvent formulations that are utilized in the specific cleaning formulations set forth herein are:
   Mixtures of NMP (from about 50% to about 55%) and water (from about 28% to about 40%).
   Mixtures of BLO (from about 40% to about 50%) and water (from about 30% to about 50%). Other non-amine polar organic solvents are expected to be suitable either alone or when mixed with water.

Other organic chelating agents that provide good results are:
   Methyl acetoacetate—from about 0.01% to about 10%
   Dimethylmalonate—from about 0.01 to about 10%
   Lactic acid—from about 0.01% to about 10%
   Levulinic acid—from about 0.01 to about 5%

A significant feature of the new formulations is the use of a chelating agent in a solvent solution which contains essentially no strong inorganic acid, strong base and/or amine containing component. For purposes of the present invention, a strong acid is defined as having a pKa of less than about 0. A strong base, for purposes of the present invention is defined as a base having a conjugate acid with a pKa greater than 0.

Additional specific cleaning formulations of the present invention include:
1. 2,4-Pentanedione—from about 5% to about—12%;
   BLO—from about 35% to about 40%; and
   Water—from about 45% to about 55%,
2. 2,4-Pentanedione—from about 7% to about 15%;
   NMP—from about 45% to about 55%; and
   Water—from about 35% to about 45%,
3. Oxalic acid—from about 3% to about 5%;
   NMP—from about 55% to about 75%; and
   Water—from about 20% to about 50%,
4. Methyl acetoacetate—from about 5% to about 10%;
   BLO—from about 30% to about 40%; and
   Water—from about 50% to about 75%,
5. Malonic acid—from about 5% to about 10%;
   NMP—from about 50% to about 55%; and
   Water—from about 40% to about 60%,
6. Malonic acid—from about 5% to about 10%;
   BLO—from about 20% to about 30%; and
   Water—from about 45% to about 60%,
7. Malonic acid—from about 5% to about 10%;
   CHP—from about 20% to about 75%; and
   Water—from about 20% to about 40%,
8. Malonic acid—from about 5% to about 10%;
   Sulfolane—from about 20% to about 70%; and
   Water—from about 20% to about 40%,
9. Malonic acid—from about 5% to about 10%;
   1,4-Butanediol—from about 20% to about 75%; and
   Water—from about 20% to about 40%,
10. p-Toluenesulfonic acid—from about 5% to about 10%;
    NMP—from about 50% to about 60%; and
    Water—from about 40% to about 60%; and
11. Trifluoroacetic acid—from about 10% to about 12%;
    NMP—from about 20% to about 50%; and
    Water—from about 40% to about 60%.

Other 1,3-dicarbonyl compounds and related compounds are expected to display comparable performance. These would have the following general structure:
   X—CHR—Y in which
   R is either a hydrogen atom or an alkyl group and X and Y are functional groups containing multiply bonded moieties known to have electron-withdrawing properties, for example X and Y may be CZ=O, C=N, CZ=N, CZ–S, NZ=O, SZ—) in which Z represents another atom or group of atoms. X and Y may be identical or different.

In another embodiment of the present invention the amount of organic chelating agent and polar solvent may be selected, within the ranges specified above, to provide a pH for the cleaning formulation which falls within a range from about 1.5 to about 6.9, and more preferably from about 1.5 to about 5.0 and most preferably from about 1.8 to about 4.0.

It would also be expected that inclusion of optional components such as surfactants, stabilizers, corrosion inhibitors, buffering agents, and co-solvents would constitute obvious additions to those practiced in the art.

The following preferred specific embodiments are to be construed as merely illustrative, and not limitative of the remainder of the disclosure in any way whatsoever. In the preceding text and the following examples, all temperatures are set forth in degrees Celsius and all parts and percentages are by weight, unless otherwise indicated.

EXAMPLE 1

A first example of the present invention involved wafers having 3-layer metal lines containing a top layer of titanium nitride (1200 Å thick), a middle layer of aluminum (99.5%) copper (0.5%) alloy (10,000 Å thick), and a bottom layer of Titanium/Tungsten alloy (1500 Å thick). The substrate was silicon oxide and the width of metal lines was approximately 0.8 microns.

The wafers were metal-etched with a chlorine-containing plasma which was followed by an oxygen plasma ashing of the resist. This was followed by immersion of the wafers in a formulation of the present invention containing catechol 10%, water 50% and BLO 40% at 60° C. for 30 minutes followed by washing with deionized water. Further testing has demonstrated that effective residue removal is obtained in a temperature range of 45° to 75° C., and with wafer exposure times in a range of 15 to 60 minutes. Additionally, rather than utilizing wafer immersion techniques, the solutions could be sprayed onto the wafers using automated spray tools followed by a water rinse.

EXAMPLE II

A second set of wafers which were identical to the set utilized in Example I, were processed utilizing a different cleaning formulation. Specifically, the wafers were metal-etched with a chorine-containing plasma which was followed by an oxygen plasma ashing of the resist. This was followed by immersion of the wafers in a bath of the present invention containing catechol 8% and water 92%, at 60° C. for 30 minutes followed by washing with deionized water. As with the prior example, a formulation temperature of 45 to 75° C. with a wafer exposure time of 15 to 60 minutes will produce satisfactory results.

Regarding both examples above, inspection of SEM photomicrographs of processed wafers was utilized to evaluate the stripping effectiveness of the formulations and also to confirm lack of corrosivity to metal features.

EXAMPLE III

Commercially generated wafers that have been etched with chlorine or fluorine-containing plasmas followed by oxygen plasma ashing have surface residues that typically contain inorganic materials such as, but not limited to, aluminum oxide and titanium oxide. These residues are often difficult to dissolve completely without causing corrosion of metal and titanium nitride features required for effective device performance.

Five types of commercially generated wafers containing vias and metal lines were processed using the formulation of the present invention. In each case, following plasma etching and ashing, the residue was removed from the wafer by immersion of wafers in baths of 60° C. for 30 minutes followed by washing with deionized water and drying with a stream of nitrogen gas. It is expected that the solutions can also be applied by spraying onto the wafers in an automated spray tool followed by a water rinse.

The four via and metal line structures were:
1. 0.8 micron diameter, four layer vias comprised of silicon oxide top and second layers, a third layer of titanium nitride, and a bottom layer of aluminum, silicon, copper (AlSiCu) alloy. The substrate was silicon oxide.
2. One micron diameter, two-layer vias comprised of a top layer of silicon oxide (7000 Å thick) and a middle layer of titanium nitride (1200 Å thick) on top of a silicon substrate.
3. 1.2 micron wide, 4-layer metal lines with a top layer of titanium/tungsten (1200 Å thick), a second layer of aluminum (6000 Å thick), a third layer of titanium/tungsten (1200 Å thick), and a bottom layer of titanium (500 Å thick) on a silicon oxide substrate.
4. Two micron wide, 3-layer metal lines with a top layer of titanium (200 Å thick), a middle layer of aluminum/silicon/copper (750 Å thick), and a bottom layer of titanium/tungsten (1250 Å thick) on a silicon oxide substrate.
5. One micron diameter, damascene structure with a top layer of oxide (300 Å thick), a second layer of low-k dielectric (8000 Å thick), and a third layer of silicon nitride etch stop (200 Å thick) on a final layer of copper. The low-k is an organic polyarylene ether polymer such as SiLK or a carbon and/or hydrogen doped silicon oxide such as Coral, LKD and HOSP.

Based on inspection of scanning electron microscope photographs of treated wafers before and after treatment, the preferred formulations successfully removed residues without signs of corrosion on metal and/or alloy layers.

While the present invention has been shown and described with reference to particular preferred embodiments, it is to be understood that other and further changes and modifications of the invention will become apparent to those skilled in the art after understanding the present invention. It is therefore intended that the following claims cover all such alterations and modifications as fall within the true spirit and scope of the invention.

What is claimed is:

1. A semiconductor wafer cleaning formulation for use in post plasma ashing semiconductor fabrication comprising at least one organic chelating agent and at least two polar solvents, wherein the chelating agent and polar solvents are in sufficient amounts to effectively remove residue from a semiconductor wafer, wherein said formulation is free from components selected from the group consisting of strong inorganic acids, strong bases, amine-containing components, and catalysts, and wherein the at least two polar solvents comprise water and at least one organic solvent selected from the group consisting of: Cyclohexylpyrrolidone (CHP) and 1,4-Butanediol.

2. The cleaning formulation according to claim 1 wherein the amounts of the organic chelating agent and said at least two polar solvents range from about 2% to about 98%.

3. The cleaning formulation according to claim 1 wherein the at least one organic chelating agent includes a first chelating agent in a percentage by weight range, wherein the first chelating agent and its percentage by weight range are selected from the group consisting of: 2,4-Pentanedione 0.01-98%, Malonic acid 0.01-10%, Oxalic acid 0.01-5%, p-Toluenesulfonic acid 0.01-10%, and Trifluoroacetic acid 0.01-12%.

4. The cleaning formulation according to claim 2 wherein the amount of water in percent by weight, based on the total weight of the formulation, is from 0.01% to 98%.

5. The cleaning formulation according to claim 3 wherein the amount of the at least one organic solvent in percent by weight, based on the total weight of the formulation, is selected from the group consisting of Cyclohexylpyrrolidone (CHP) 0.01-75% and 1,4-Butanediol 0.01-75%.

6. The cleaning formulation according to claim 1 wherein sulfonic acid is not present in said formulation.

7. The cleaning formulation according to claim 1 wherein the residue is inorganic.

8. A semiconductor wafer cleaning formulation for use in post plasma ashing semiconductor fabrication, wherein said formulation is free from components selected from the group consisting of strong inorganic acids, strong bases, amine-containing components, and catalysts, wherein said formulation is selected from the group consisting of:
   a. Malonic acid from about 5% to about 10%;
      CHP from about 20% to about 75%;
      Water from about 20% to about 40% and
   b. Malonic acid from about 5% to about 10%;
      1,4-Butanediol from about 20% to about 75%; and
      Water from about 20% to about 40%.

9. A method for fabricating a semiconductor wafer which includes the steps comprising:
   cleaning said wafer using a chemical formulation comprising at least one organic chelating agent and at least two polar solvents wherein the organic chelating agent and polar solvents are in sufficient amounts to effectively remove residues from a semiconductor wafer, wherein said chemical formulation is free from components selected from the group consisting of strong inorganic acids, strong bases, amine-containing components, and catalysts, and wherein the at least two polar solvents comprise water and at least one organic solvent selected from the group consisting of: Cyclohexylpyrrolidone (CHP) and 1,4-Butanediol.

10. The method according to claim 9 wherein the amounts of chelating agent and said at least two polar solvents range from about 2% to about 9%.

11. The method according to claim 9 wherein the organic chelating agent in the percentage by weight range shown is selected from the group consisting of: 2,4-Pentanedione 0.01-98%, Malonic acid 0.01-10%, Oxalic acid 0.01-5%, p-Toluenesulfonic acid 0.01-10%, and Trifluoroacetic acid 0.01-12%.

12. The method according to claim 10 wherein the amount of water in percent by weight, based on the total weight of the formulation, is from 0.01% to 98%.

13. The method according to claim 11 wherein the amount of the at least one organic solvent in percent by weight, based on the total weight of the formulation, is selected from the group consisting of: Cyclohexylpyrrolidone (CHP) 0.01-75% and 1,4-Butanediol 0.01-75%.

14. The method according to claim 13 wherein the wafer is exposed to said chemical formulation for a time period of 15-60 minutes at a temperature range of 45-75° C.

15. The method according to claim 9 wherein sulfonic acid is not present in said chemical formulation.

16. A method for fabricating a semiconductor wafer which includes the steps comprising:
   cleaning said wafer using a chemical formulation comprising at least one organic chelating agent and at least two polar solvents wherein the organic chelating agent and polar solvents are in sufficient amounts to effectively remove residues from a semiconductor wafer, wherein said chemical formulation is free from components selected from the group consisting of strong inorganic acids, strong bases, amine-containing components, and catalysts,
   wherein the chemical formulation is selected from the group consisting of:
   a. Malonic acid from about 5% to about 10;
      CHP from about 20% to about 75%; and
      Water from about 20% to about 40%; and
   b. Malonic acid from about 5% to about 10%;
      1,4-Butanediol from about 20% to about 75%; and
      Water from about 20% to about 40%.

17. The method according to claim 16 wherein the wafer is exposed to said chemical formulation for a period of 15-60 minutes at a temperature range of 45-75° C.

18. A method for preparing a chemical formulation for cleaning residue from a semiconductor wafer after an ashing process, the method comprising:
   preparing a formulation comprising at least one organic chelating agent and at least two polar solvents combined in a sufficient amount to effectively remove substantially all residue from the semiconductor wafer, wherein said chemical formulation is free from components selected from the group consisting of strong inorganic acids, strong bases, amine-containing components, and catalysts, and wherein the at least two polar solvents comprise water and at least one organic solvent selected from the group consisting of Cyclohexylpyrrolidone (CUP) and 1,4-Butanediol.

19. The method according to claim 18 wherein the amounts of the organic chelating agent and said at least two polar solvents range from about 2% to about 98%.

20. The method according to claim 18 wherein the organic chelating agent in the percentage by weight range shown is selected from the group consisting of: 2,4-Pentanedione 0.01-98%, Malonic acid 0.01-10%, Oxalic acid 0.01-5%, p-Toluenesulfonic acid 0.01-10%, and Trifluoroacetic acid 0.01-12%.

21. The method according to claim 18 wherein the amount of water in percent by weight, based on the total weight of the formulation, is from 0.01% to 98%.

22. The method according to claim 20 wherein the amount of the at least one organic solvent in percent by weight, based on the total weight of the formulation, is selected from the group consisting of: Cyclohexylpyrrolidone (CHP) 0.01-75% and 1,4-Butanediol 0.01-75%.

23. The method according to claim 18 Wherein sulfonic acid is not present in said chemical formulation.

24. The method according to claim 18 wherein the residue is an inorganic compound.

25. A method for preparing a chemical formulation for cleaning residue from a semiconductor wafer alter an ashing process, the method comprising:
   combining at least one organic chelating agent and at least two polar solvents in a sufficient amount to effectively remove substantially all residue from the semiconductor wafer, wherein said chemical formulation is free from components selected from the group consisting of strong inorganic acids, strong bases, amine-containing components, and catalysts,
  a. Malonic acid from about 5% to about 10%;
     CHP from about 20% to about 75%; and
     Water from about 20% to about 40% and
  b. Malonic acid from about 5% to about 10%;
     1,4-Butanediol from about 20% to about 75%; and
     Water from about 20% to about 40%.

26. The cleaning formulation according to claim 1 wherein the organic chelating agent comprises malonic acid.

27. The cleaning formulation according to claim 1 wherein the at least one organic solvent comprises 1,4-Butanediol.

28. The method according to claim 9 wherein the organic chelating agent comprises malonic acid.

29. The method according to claim 9 wherein the at least one organic solvent comprises 1,4-Butanediol.

30. The method according to claim 18 wherein the organic chelating agent comprises malonic acid.

31. The method according to claim 18 wherein the at least one organic solvent comprises 1,4-Butanediol.

32. The cleaning formulation according to claim 1 having a pH in a range from 1.5 to 6.9.

33. The cleaning formulation according to claim 1 wherein the organic chelating agent comprises 2,4-pentanedione.

34. The cleaning formulation according to claim 1 wherein the organic chelating agent comprises p-toluenesulfonic acid.

* * * * *